United States Patent [19]

Svendsen, Leo G. et al.

[11] Patent Number: 4,903,889
[45] Date of Patent: Feb. 27, 1990

[54] CONNECTION TO A COMPONENT FOR USE IN AN ELECTRONICS ASSEMBLY

[75] Inventors: Svendsen, Leo G., Redwood City; Rebecca A. Leary, Milpitas; Gary I. Geschwind, Palo Alto, all of Calif.

[73] Assignee: Raychem Corporation, Menlo Park, Calif.

[21] Appl. No.: 383,223

[22] Filed: Jul. 19, 1989

Related U.S. Application Data

[63] Continuation of Ser. No. 270,890, Nov. 14, 1988, abandoned.

[51] Int. Cl.⁴ .................. B23K 1/12; B23K 35/14; B23K 35/22
[52] U.S. Cl. .................. 228/180.2; 228/246; 228/56.3
[58] Field of Search .................. 228/123, 180.2, 56.3, 228/57, 246; 361/404; 174/68.5, 99 R

[56] References Cited

U.S. PATENT DOCUMENTS

| | | | |
|---|---|---|---|
| 4,354,629 | 10/1982 | Grassauer et al. | 228/56.3 |
| 4,402,450 | 9/1987 | Abraham et al. | 228/180 A |
| 4,661,887 | 4/1987 | Lin | 228/56.3 |
| 4,705,205 | 11/1987 | Allen et al. | 228/180.2 |
| 4,712,721 | 12/1987 | Nole et al. | 228/56.3 |

Primary Examiner—Richard K. Seidel
Assistant Examiner—Samuel M. Heinrich
Attorney, Agent, or Firm—Simon J. Belcher; Herbert G. Burkard

[57] ABSTRACT

A connection to a contact on an electronic component is made by means of a solder preform in the form of a columm, which comprises a solder body at least partially enclosed within a tubular support. The preform is positioned such that its longitudinal axis is approximately parallel to the plane of the contacts at the point at which it is connected thereto.

39 Claims, 3 Drawing Sheets

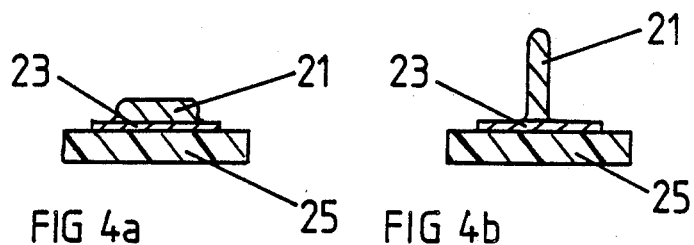
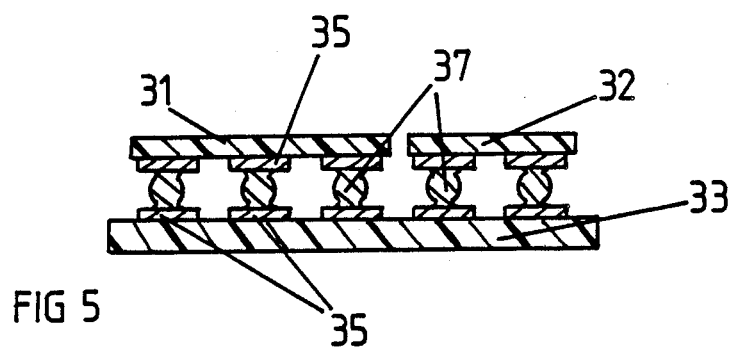

CONNECTION TO A COMPONENT FOR USE IN AN ELECTRONICS ASSEMBLY

This application is a continuation of application Ser. No. 270,890, filed Nov. 14, 1988, now abandoned.

BACKGROUND TO THE INVENTION

This invention relates to the formation of connections to a component for use in an electronics assembly. The connections may be mechanical, electrical or both. As used herein, the term "component" shall be applicable to parts of an assembly which modify and electrical signal, such as resistors, capacitors, diodes, transistors and integrated circuits, and to parts on which components are mounted or which serve to interconnect components, which may often be referred to generally as substrates, for example a printed circuit board as used for surface mounting of components.

Electronics assemblies of interconnected components, typical of the type with which the present invention is concerned, generally comprise a substrate component such as a printed circuit board on which other components are mounted. A component may have a small number of contacts for connection to contacts on one or more other components, for example it may have four contacts or less as in the case of a capacitor or a resistor, or it may have a large number of contacts, for example more than four, as in the case of an integrated circuit in a leadless ceramic casing. In case of complicated integrated circuits, especially those which have for example 32 contacts or more, the component that is mounted on the substrate may be a carrier on which the integrated circuit itself is mounted, such as a ceramic leadless chip carrier.

As the space occupied by individual components on a substrate component is gradually reduced as a result of miniaturization of the components, the density of contacts on the components increases. It is important to ensure that conductive material that is used to form connections between components does not also form unwanted connections between contacts. Particularly as the density of contacts increases, it becomes important to ensure that any debris remaining from making connections between components is removed. Furthermore, debris from the connections, whether conductive or not, can often be corrosive.

Solder is a commonly used material for making connections between components. When making a solder connection, it is important to ensure that excess solder and flux residues do not contaminate the connection area and, in particular, do not form unwanted connections between contacts. It is desirable therefore to leave a space between the bodies of components which are to be connected in order to be able to clean the connection area of any unwanted material. Furthermore, such a space enables the connection area to be inspected to determine whether the quality of the solder connection is satisfactory, as well as to determine whether all unwanted material has been removed.

U.S. Pat. No. 4,705,205 discloses a method of forming a connection between components, using elongate preforms of solder material which, when heated, retain their preform shape. This retention of shape may be achieved by supporting the solder by means of a support strand or tape which is disposed helically about the outside of the solder preform. The preforms are positioned so that their longitudinal axes extend perpendicularly from the surface of each of the contacts which they interconnect. This arrangement has been found to facilitate cleaning and inspection of the areas of the connections between the preform and the contacts. Furthermore, it has the advantage that the connections between the components are resilient, and are therefore able to withstand stresses arising from differences in thermal expansion of the interconnected components. However, it has been found that the small size and unstable orientation of the preforms can make correct manipulation of the preforms difficult.

U.S. Pat. No. 4712721 discloses a system for delivering solder preforms, in which preforms are disposed in apertures in an elongate tape. When the preforms are columnar, they are positioned so that their axes are parallel to the plane of the tape.

U.S. Pat. No. 4,402,450 discloses a method of bonding to a contact, by means of a composite member comprising a hard element encased in a quantity of solder. The solder can form a connection to the contact, and the hard element acts as a spacer defining a desired minimum distance between the contact and another component. This arrangement has the disadvantage that the distance between components is controlled solely by the thickness of a hard element. This means that the arrangement requires a different hard element for different desired spacings, and is somewhat less capable of tolerating an array of contacts that is not exactly planar. Furthermore, notwithstanding the fact that they provide a spacing between connected components, connections made by the disclosed method are not particularly resilient, since the spacing is provided by a hard, inflexible element.

DESCRIPTION OF THE INVENTION

According to the present invention, connections to components are made by means of solder preforms in the form of columns which comprise a support at least partially filled with solder, the preform being positioned on the component with its longitudinal axis (defined with respect to the column and the support) approximately parallel to the surface of the component at the point at which the connection between the preform and the component is made.

In one aspect, the invention provides a component for use in an electronics assembly, comprising:
 (a) a contact; and
 (b) a solder preform in the form of a column, which comprises:
  (i) a solder body, and
  (ii) a tubular support, longitudinally and/or radially spaced apart portions of the wall or walls of the support that extend parallel to its longitudinal axis having apertures therein communicating between the interior and the exterior of the support,
the solder of the body being enclosed at least partially within the support, the apertures being so arranged that when the solder within the support is molten, it is capable of remaining substantially within the support by virtue of its surface tension;

The preform being connected to the contact by means of a solder connection such that the longitudinal axis of the preform is approximately parallel to the plane of the contact at the point at which the connection between the contact and the preform is made.

In another aspect, the invention provides a method of making a connection to a component for use in an electronics assembly, which comprises:

(a) providing a first electronic component having a contact to which a connection is to be made, the contact bearing a layer of solder;

(b) positioning on the contact a solder preform in the form of a column which comprises:
(i) a solder body, and
(ii) a tubular support, longitudinally and/or radially spaced apart portions of the wall or walls of the support that extend parallel to its longitudinal axis having apertures therein communicating between the interior and the exterior of the support, the solder of the body being enclosed at least partially within the support, the apertures being so arranged that when the solder within the support is molten, it is capable of remaining substantially within the support by virtue of its surface tension;

the preform being positioned such that its longitudinal axis is approximately parallel to the plane of the contact at the point at which the connection between the contact and the preform is made;

(c) applying heat to cause the layer of solder to on the contact to melt and to wet the preform; and (d) allowing the solder to solidify.

The present invention thus provides a connection technique which allows a predetermined spacing between connected components to be maintained. This facilitates inspection of the connection and removal of unwanted debris which might interfere with electrical properties in the area of the connection. The positioning of the preforms on their sides, in accordance with the present invention, is particularly suitable in situations in which a predetermined spacing between components is desirable, and ability to withstand stresses arising from differences in thermal expansion is less important. Furthermore, it has been found surprisingly that a space between an electronic component and a substrate such as a printed circuit board on which it is mounted can reduce stresses imposed on conductive traces on the substrate due to thermal expansion effects.

The positioning of columnar preforms on their side has the advantage that the problems of handling small preforms, for example having a transverse dimension of less than 150 micrometers, in particular of positioning such small preforms on their ends, are overcome, at least to a large extent. This allows columnar preforms to be used to form connections to an array of contacts having a pitch of as small as 500 micrometers, for example 250 micrometers or even less.

Furthermore, preforms positioned on their sides may be used to mount components having a small number of contacts, such as resistors and capacitors, on a substrate, the connections between the components being very much less fragile than connections in which preforms are mounted on their ends.

A particularly important advantage of the use of a tubular support is that the solder of the solder body is substantially retained within the reservoir defined by the support, even when it is molten. This allows the preforms of the invention to tolerate an array of contacts that is not exactly planar, by transverse deformation of the support when the solder is molten.

The use of a tubular support in a columnar preform positioned on its side has the advantage that the preforms can be modified to suit the pitch between contacts to which connection is to be made, or to suit the height requirements for cleaning and inspection, by transverse deformation of the support. Such a deformed preform will have a flattened cross-section so that it has a short transverse axis and a long transverse axis. Before deformation (if any), the support may have a circular cross-section as preferred for ease of manufacture, or it may have a non-circular cross-section, for example oval, square or rectangular. The cross-section of the preform may vary along its length. For example the preform may be tapered inwardly towards its midsection. It is particularly preferred to manufacture preforms with a circular cross-section and then to deform them transversely so that two opposite walls are substantially straight and are joined by two curved walls.

In a further aspect the invention provides a method of making a solder preform in the form of a column, which comprises:

(a) at least partially enclosing a solder body within a tubular support, longitudinally and radially spaced apart portions of the wall or walls of the support that extend parallel to its longitudinal axis having apertures therein communicating between the interior and the exterior of the support, arranged so that when the solder within the support is molten, it is capable of remaining within the support by virtue of its surface tension;

(b) flattening the preform transversely.

A preform having a flattened cross-section may be mounted on a contact so that its long transverse axis is substantially perpendicular to the plane of the contact at the point at which the connection between the contact and the preform is made. This allows the preforms to be used to form connections to an array of closely spaced contacts.

The method may include the step of heating the preform to cause the solder of the solder body to melt.

A preform having a flattened cross-section may be mounted on a contact so that its long transverse axis is substantially parallel to the plane of the contact at the point at which the connection between the contact and the preform is made. This technique can be used to form so-called "solder bumps" as used in the microelectronics assembly industry, and has the advantage over other techniques for forming solder bumps that the height of the bump is controlled both when the bump is formed and when used to interconnect two components with a predetermined spacing between them. This technique also has the advantage that preforms can be positioned on their respective contacts in a stable orientation which is desirable for ease of handling.

The preforms are preferably formed continuously by forming a long solder preform precursor. Individual preforms are then formed by severing the precursor.

The length of each preform is preferably less than about 7500 micrometers, more preferably in the range of from about 250 micrometers to about 1250 micrometers.

The transverse dimensions of each preform are preferably less than about 700 micrometers. When the preform has a flattened cross-section, the shorter transverse dimension is preferably in the range of from about 175 micrometers to about 300 micrometers.

The use of an apertured tubular support for a preform which is mounted on its side has been found to have many advantages. For example, as discussed above, advantages arise from the ability of the support to retain the solder within it. It ensures that the solder of the solder body does not flow and that the transverse dimension of the preform does not change significantly when it is heated to a temperature at which the solder melts. This is particularly important when a large number of preforms are mounted on a face of a single component, and are heated individually to form connections. Furthermore, the support acts to reinforce the preform when in use, while still allowing it to flex to some extent, particularly when the solder of the solder body is relatively ductile. This can lead to the connections made by means of the preforms being able to tolerate stresses, for example as imposed by differential thermal expansion of two interconnected components, and furthermore, can reduce significantly the propagation of stress cracks in the solder connection between the preform and a contact. Moreover, a connection between contacts made according to the present invention has the significant advantage that the physical link between the interconnected contacts can be provided entirely by solder. This allows the concentration of stresses at the interface between solder and a hard element acting as a spacer to be avoided. Another advantage of mounting the preform on its side is that it provides a large bond area, thus increasing the strength of the bond.

The support is provided with apertures in longitudinally and radially spaced apart portions of its wall or walls that extend parallel to its longitudinal axis. The apertures communicate between the interior and exterior of the support, and allow solder present on a contact to fuse with the solder in the preform so as to make a connection between the contact and the preform. Preferably the apertures cover from about 40% to about 90% of the surface area of the said wall or walls. The size, configuration and arrangement of the apertures will be such that, when the solder is molten, it is capable of remaining within the support by virtue of its surface tension. Consistent with this requirement, the proportion of the surface area of the wall(s) covered by the apertures can be varied to suit the mechanical properties desired of the preform.

The support may comprise a tubular member whose walls have been perforated, for example by drilling or punching. It may comprise a plurality of spaced apart hoop-like members. Preferably the support comprises one or more wound elements; for example it may comprise a helically wound element. The element may have a round cross-section or a non-round cross-section. Preferably the element has a flattened cross-section. It is particularly preferred that the element is a tape with a rectangular cross-section. Two or more elements may be used. The elements may be wound opposite senses, so that the support comprises a braid. When the support comprises one or more wound elements, the apertures are of course provided at those portions of the wall or walls of the support between successive turns of the element.

The principal requirements of the material of the support are that it is capable of acting as a support particularly when the solder is molten, and that it is wettable by the solder. Metallic materials are therefore preferred (particularly copper or nickel, or alloys such as certain solder materials which have a melting temperature or temperature range which is higher than that of the solder body), although polymeric materials may be used, particularly plated polymeric materials.

The support may be formed in situ around a rod-like solder body. This is preferred when the support comprises a wound element. On the other hand, the support may be preformed, and the solder body subsequently positioned within it, for example by dipping the support in a quantity of fused solder.

The preforms may include a layer of solder on the outer surface of the support. The layer may be provided after the solder body has been positioned within the support, or the solder body and the outer layer of solder may be provided in a single step. An outer layer of solder, when provided, may fill the apertures in the support so that the external surface of the preform is devoid of impressions of the apertures.

The solder used in the preform will be a eutectic solder for some applications, this being preferred for the indication of when sufficient heat has been supplied to the solder to make a connection. In some applications, certain solders may be preferred for other physical characteristics; for example, it can be particularly preferred to use a solder which is relatively ductile especially if it is desired to deform a preform transversely by the application of pressure thereto. A solder that is preferred for this reason comprises 80% lead and 20% tin, the percentages being expressed by weight.

The preform will generally be used to form a connection between contacts on two or more electronic components. The preform being positioned between the components, and being bonded to the contacts by means of the solder. When used to form a connection between two or more contacts, a preform may first be connected to a contact on a first component, before connections to a second component are made in a subsequent step. This has the advantage that it allows the preforms to be positioned accurately on the respective contacts on the first component, this advantage being particularly important when one or more of the components has a large number of contacts to which connections are to be made.

Connections between contacts on two or more components may be made by a process which involves a single heating step, in which the preform is positioned between the contacts and heat is applied to make the connections to the contacts. This has the advantage that the number of steps of the assembly process is minimized. It is particularly suitable when the preforms are to be disposed in a stable orientation, for example when the preforms have a flattened cross-section and are to be positioned with their long transverse axis parallel to the surface of the contact.

The invention also provides a substantially planar array of solder preforms, each of at least some of which being in the form of a column, and comprising:
 (i) a solder body, and
 (ii) a tubular support, longitudinally and/or radially spaced apart portions of the wall or walls of the support that extend parallel to its longitudinal axis having apertures therein communicating between the interior and the exterior of the support, the solder of the body being enclosed at least partially within the support, the apertures being so arranged that when the solder within the support is molten, it is capable of remaining substantially within the support by virtue of its surface tension; in which the longitudinal axis of each of at least some of the preforms is approximately parallel to the plane of the array at the point at which it is mounted therein.

The preforms in the array may be on respective contacts on the surface of an electronic component, in which case the planarity of the array will match the planarity of the surface of the component. The preforms may be mounted in or on a holder which maintains them in the array. Preferably the preforms are mounted releasably in or on the holder so that they can be positioned one on each contact, and then bonded to their respective contacts by means of the solder. The holder may then be removed if desired. To facilitate removal, the holder may be segmented, frangible or dissolvable. The use of a holder facilitates handling of the preforms.

The preforms may be retained on a holder by means of an adhesive such as a pressure sensitive adhesive. Alternatively or in addition, preforms may be retained by being a friction fit in a holder.

When the preforms have a flattened cross-section, they will be mounted in the holder with orientations corresponding to their desired orientation when in use.

The material of the holder may be flexible which allows the holder to conform to the surface of a component so that the preforms can contact their respective contacts. A suitable flexible holder comprises a flexible polymeric sheet coated with a pressure sensitive adhesive.

BRIEF DESCRIPTION OF THE DRAWINGS

FIGS. 4a and 4b are sections through solder preforms mounted on respective contacts in different orientations;

FIG. 5 is a section through three electronic components having contacts that are interconnected by means of solder preforms;

DESCRIPTION OF PREFERRED EMBODIMENTS

Figure 1:
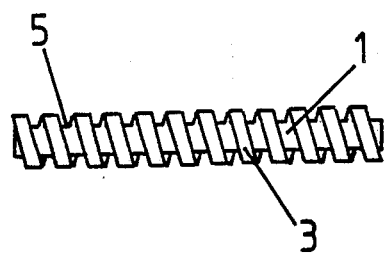
FIG. 1 is an elevational view of a solder preform.
Figure 2:
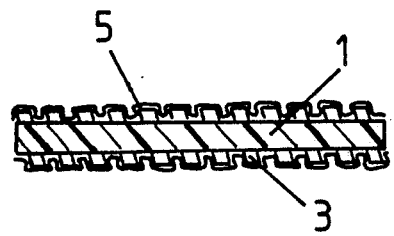
FIG. 2 is a longitudinal section through the preform shown in FIG. 1.

FIGS. 1 and 2 shows a solder preform which consists of a rod of solder 1 having a tape 3 helically wound around its external surface. The rod and tape have an outer coating 5 of solder formed by dipping into a quantity of fused solder.

Figure 3:
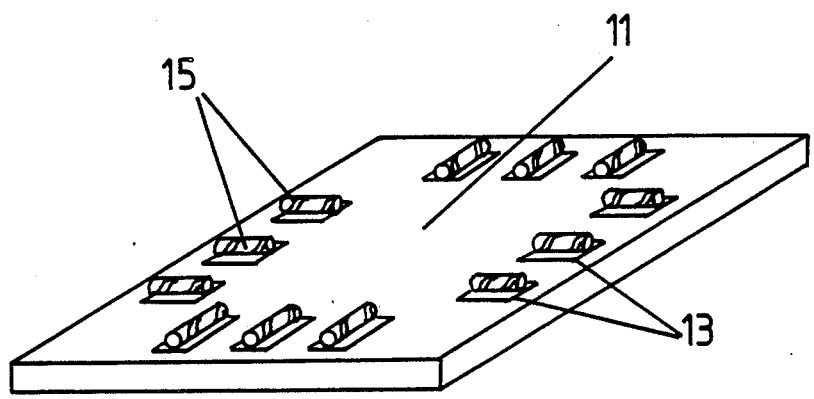
FIG. 3 is an isometric view of an array of solder preforms mounted on respective contacts on an electronic component.

FIG. 3 shows an electronic component 11 such as a chip carrier for mounting on a substrate component such as a printed circuit board. The chip carrier has a number of contacts 13 on its surface, each bearing a solder preform 15 of the type shown in FIGS. 1 and 2.

The surface of the chip carrier thus bears an array of preforms 15, one on each of the contacts 13.

FIGS. 4a and 4b show a preform 21 mounted on a contact 23 on a component 25. The preform has a flattened cross-section as a result of the application of transverse pressure thereto, so that it has a short transverse axis and a long transverse axis. As shown in FIG. 4a, the long transverse axis is parallel to the plane of the contact 23.

As shown in FIG. 4b, the short transverse axis is parallel to the plane of the contact 23.

FIG. 5 shows two electronic components, a chip carrier 31 and a chip resistor 32, mounted on a substrate component 33 such as a printed circuit board, each of the components having an array of contacts 35 which are interconnected by means of solder preforms 37. Each of the contacts 35 has a layer of solder provided on it. The components are interconnected by first positioning the preforms on respective contacts on the chip carrier 31 and resistor 32 and applying heat to cause the solder on the contact to melt and to wet the preforms. The heat is then removed so that the solder solidifies and forms a bond. The components are then positioned so that the preforms are in contact with the contacts on the board. Heat is then applied once more to cause the solder on the contacts on the board to melt and to wet the preforms. On removal of the heat, the solder solidifies and forms bonds between the preforms and the contacts on the board.

When heat is applied to the preforms, and the solder is molten, it is prevented from flowing out of the support through the apertures by its surface tension. The reservoir of molten solder within the support is, however, accessible and interactions between the molten solder within the support and solder located on a contact help to optimize the electrical properties of the connection. The retention of solder within the support also helps to optimize the mechanical properties of the connection, particularly when the solder of the solder body is ductile. Moreover, a connection between contacts made according to the present invention has the significant advantage that the physical link between the interconnected contacts can be provided entirely by solder. This allows the concentration of stresses at the interface between solder and a hard element acting as a spacer to be avoided.

Figure 6:
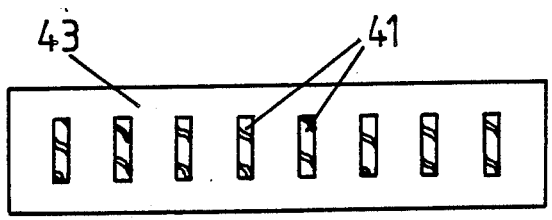
FIG. 6 is a plan view of an array of solder preforms.

FIG. 6 shows an array of solder preforms 41 mounted on a holder 43. The holder comprises a strip of a polymeric material having recesses in which the preforms are held by friction. The spacing of the preforms on the holder corresponds to the spacing of the contacts on the component on which the preforms are to be mounted. The holder facilitates positioning of the preforms on a corresponding array of contacts on a component. The holder may be removed after the connections between the preforms and respective contacts on a component have been made.

Figure 7A:
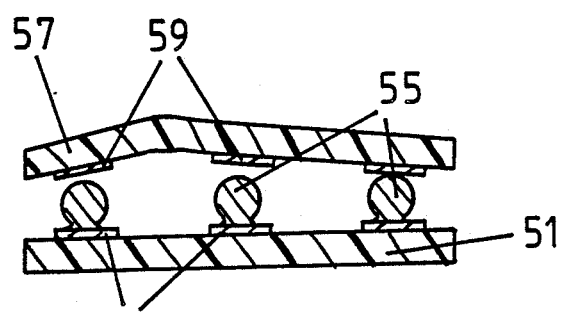
FIGS. 7a and 7b are sections through two electronic components before and after interconnection.
Figure 7B:
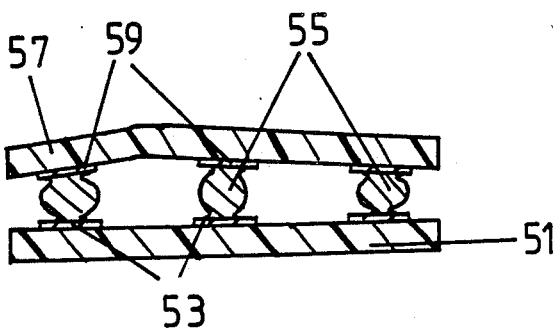

FIG. 7a shows a first component 51 having contacts 53 on which preforms 55 are fixed. A second component 57 having contacts 59 is positioned with its contacts above respective ones of the preforms. The second component 57 is nonplanar, so that not all of its contacts can touch respective ones of the preforms. The deformability of the tubular support, and its ability to retain the solder within it when molten, allows the preforms to be deformed by forcing the first and second components towards one another while heat is applied to make the connections between the preforms and the contacts on the second component. The preforms are thereby able to tolerate the lack of planarity of the second component, as shown in FIG. 7b.

What is claimed is:

1. A component for use in an electronics assembly, comprising:
    (a) a contact; and
    (b) a solder preform in the form of a column, which comprises:
        (i) a solder body, and
        (ii) a tubular support, longitudinally and/or radially spaced apart portions of the wall or walls of the support that extend parallel to its longitudinal axis having apertures therein communicating between the interior and the exterior of the support,
    the solder of the body being enclosed at least partially within the support, the apertures being so arranged that when the solder within the support is molten, it is capable of remaining substantially within the support by virtue of its surface tension;

the preform being connected to the contact by means of a solder connection such that the longitudinal axis of the preform is approximately parallel to the plane of the contact at the point at which the connection between the contact and the preform is made.

2. A component as claimed in claim 1, in which the tubular support comprises a helically wound element.

3. A component as claimed in claim 2, in which the element has a non-round cross-section.

4. A component as claimed in claim 2, in which the element has a flattened cross-section.

5. A component as claimed in claim 4, in which the element is a tape.

6. A component as claimed in claim 1, in which the solder preform has a flattened cross-section so that it has a short transverse axis and a long transverse axis.

7. A component as claimed in claim 6, in which the preform is mounted on the contact so that its long transverse axis is substantially perpendicular to the plane of the contact at the point at which the connection between the contact and the preform is made.

8. A component as claimed in claim 6, in which the preform is mounted on the contact so that its long transverse axis is substantially parallel to the plane of the contact at the point at which the connection between the contact and the preform is made.

9. A component as claimed in claim 1, in which the length of the preform is less than about 7500 micrometers.

10. A component as claimed in claim 9, in which the length of the preform is in the range of from about 250 micrometers to about 1250 micrometers.

11. A component as claimed in claim 1, in which the transverse dimensions of the preform are less than about 700 micrometers.

12. A component as claimed in claim 6, in which the shorter transverse dimension of the preform is in the range of from about 175 micrometers to about 300 micrometers.

13. A component as claimed in claim 1, which is electrically and mechanically connected to another component of an electronics assembly by means of the solder of the solder preform.

14. A method of making a connection to a component for use in an electronics assembly, comprising:
  (a) providing a first electronic component having a contact to which a connection is to be made, the contact bearing a layer of solder;
  (b) positioning on the contact a solder preform in the form of a column which comprises:
    (i) a solder body, and
    (ii) a tubular support, longitudinally and/or radially spaced apart portions of the wall or walls of the support that extend parallel to its longitudinal axis having apertures therein communicating between the interior and the exterior of the support,
  the solder of the body being enclosed at least partially within the support, the apertures being so arranged that when the solder within the support is molten, it is capable of remaining substantially within the support by virtue of its surface tension;
  the preform being positioned such that its longitudinal axis is approximately parallel to the plane of the contact at the point at which the connection between the contact and the preform is made;
  (c) applying heat to cause the layer of solder on the contact to melt and to wet the preform; and
  (d) allowing the solder to solidify.

15. A method as claimed in claim 14, in which the tubular support comprises a helically wound element.

16. A method as claimed in claim 15, in which the element is a tape.

17. A method as claimed in claim 14, in which the solder preform has a flattened cross-section.

18. A method as claimed in claim 14, which includes the steps of:
  (a) providing a second electronic component having a contact to which a connection is to be made, the contact bearing a layer of solder;
  (b) positioning the second component so that its contact is in contact with the preform;
  (c) applying heat to cause the layer of solder to on the contact to melt and to wet the preform; and
  (d) allowing the solder to solidify.

19. A method as claimed in claim 18, in which the connection between the preform and the first component is made before the connection between the preform and the second component.

20. A method of making a solder preform in the form of a column, which comprises:
  (a) at least partially enclosing a solder body within a tubular support, longitudinally and radially spaced apart portions of the wall or walls of the support that extend parallel to its longitudinal axis having apertures therein communicating between the interior and the exterior of the support, arranged so that when the solder within the support is molten, it is capable of remaining within the support by virtue of its surface tension;
  (b) flattening the preform transversely.

21. A method as claimed in claim 20, in which the preform is flattened by the application of pressure transversely thereto.

22. A method as claimed in claim 20, in which the support comprises a helically wound element.

23. A method as claimed in claim 22, which includes the step of forming the support by helically winding the element.

24. A method as claimed in claim 23, in which the element is helically wound around the solder body.

25. A method as claimed in claim 22, in which the element is a tape.

26. A method as claimed in claim 20, in which the enclosing and flattening steps produce a long solder preform precursor, the method including the step of severing the precursor to form individual preforms.

27. A method as claimed in claim 20, which includes the step of applying a layer of solder to the external surface of the support.

28. A method as claimed in claim 20, which includes the step of heating the preform to cause the solder of the solder body to melt.

29. A substantially planar array of solder preforms, each of at least some of which being in the form of a column, and comprising:
  (i) a solder body, and
  (ii) a tubular support, longitudinally and/or radially spaced apart portions of the wall or walls of the support that extend parallel to its longitudinal axis having apertures therein communicating between the interior and the exterior of the support, the solder body being enclosed at least partially within the support, and the apertures being so arranged that when the solder within the support is molten, it is capable of remaining substantially within the support by virtue of its surface tension; and in which the longitudinal axis of each of at least some of the preforms being approximately parallel to the plane of the array at the point at which it is mounted therein.

30. An array as claimed in claim 29, in which the preforms are mounted in or on a holder.

31. An array as claimed in claim 30, in which the preforms are mounted releasably in or on the holder.

32. An array as claimed in claim 30, in which the preforms are retained in or on the holder by means of an adhesive.

33. An array as claimed in claim 30, in which the preforms are retained in the holder by being a friction fit therein.

34. An array as claimed in claim 29, in which the preforms are mounted on respective contacts on the surface of an electronic component.

35. An array as claimed in claim 29, in which at least some of the preforms have a short transverse axis and a long transverse axis.

36. An array as claimed in claim 35, in which each of at least some of the preforms is mounted in the array so that its long transverse axis is substantially perpendicular to the plane of the array at the point at which it is mounted therein.

37. An array as claimed in claim 35, in which each of at least some of the preforms is mounted in the array so that its long transverse axis is substantially parallel to the plane of the array at the point at which it is mounted therein.

38. An array as claimed in claim 29, in which the tubular support comprises a helically wound element.

39. An array as claimed in claim 38, in which the element has a flattened cross-section.

* * * * *